United States Patent
Xu et al.

(10) Patent No.: US 10,112,169 B2
(45) Date of Patent: Oct. 30, 2018

(54) SYSTEM AND METHOD FOR ULTRASOUND IDENTIFICATION AND MANIPULATION OF MOLECULAR INTERACTIONS

(71) Applicant: University of Houston System, Houston, TX (US)

(72) Inventors: Shoujun Xu, Houston, TX (US); Lashan De Silva, Houston, TX (US); Li Yao, Beijing (CN)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 976 days.

(21) Appl. No.: 14/524,207

(22) Filed: Oct. 27, 2014

(65) Prior Publication Data
US 2015/0117156 A1    Apr. 30, 2015

Related U.S. Application Data

(60) Provisional application No. 61/896,214, filed on Oct. 28, 2013.

(51) Int. Cl.
| | |
|---|---|
| B01J 19/00 | (2006.01) |
| B01J 19/10 | (2006.01) |
| G01R 33/12 | (2006.01) |

(52) U.S. Cl.
CPC .......... *B01J 19/10* (2013.01); *G01R 33/1269* (2013.01)

(58) Field of Classification Search
USPC .......................................... 367/137; 600/377
See application file for complete search history.

(56) References Cited

U.S. PATENT DOCUMENTS

| | | | |
|---|---|---|---|
| 6,764,860 B2 * | 7/2004 | Lee | G01N 33/54373 134/1 |
| 7,648,844 B2 | 1/2010 | Srivastava et al. | |
| 7,689,260 B2 * | 3/2010 | Finch | A61N 1/0529 600/378 |
| 8,342,336 B2 * | 1/2013 | Diez | B03C 1/015 209/3 |
| 2002/0112541 A1 | 8/2002 | Lee | |
| 2003/0220569 A1 * | 11/2003 | Dione | A61B 8/0825 600/443 |
| 2005/0249667 A1 * | 11/2005 | Tuszynski | A61B 8/08 424/9.3 |

(Continued)

FOREIGN PATENT DOCUMENTS

| | | |
|---|---|---|
| WO | 2013/078332 A1 | 5/2013 |
| WO | 2013/140175 A1 | 9/2013 |

OTHER PUBLICATIONS

Lashan De Silva, Li Yao and Shoujun Xu. "Mechanically resolving noncovalent bonds using acoustic radiation force". Chem. Commun., 2014, 50, 10786-10789.*

(Continued)

*Primary Examiner* — James R Hulka
(74) *Attorney, Agent, or Firm* — Conley Rose, P.C.

(57) ABSTRACT

A system and method for resolving and/or mechanically manipulating molecular bonds. A method for resolving molecular bonds includes applying ultrasound to molecules to be manipulated. A magnetic signal associated with the molecules is measured. Whether ultrasound causes dissolution of the bonds of the molecules is determined based on measurements of the magnetic signal.

16 Claims, 4 Drawing Sheets

(56) References Cited

U.S. PATENT DOCUMENTS

| | | | |
|---|---|---|---|
| 2007/0073130 A1* | 3/2007 | Finch | A61N 1/0529 600/372 |
| 2009/0148857 A1* | 6/2009 | Srivastava | B01L 3/502761 435/7.1 |
| 2009/0158850 A1* | 6/2009 | Alleyne | G01N 29/221 73/623 |
| 2009/0225421 A1* | 9/2009 | Nonoda | G02B 21/24 359/507 |
| 2010/0233021 A1* | 9/2010 | Sliwa | A61M 25/0017 422/20 |
| 2011/0000826 A1* | 1/2011 | Diez | B03C 1/015 209/3 |
| 2013/0101468 A1* | 4/2013 | Boutin | C02F 1/36 422/128 |
| 2013/0158383 A1 | 6/2013 | Cheng et al. | |

OTHER PUBLICATIONS

Li Yao and Shoujun Xu. "Force-Induced Selective Dissociation of Noncovalent Antibody-Antigen Bonds". J. Phys. Chem. B, 2012, 116 (33), pp. 9944-9948.*

Johnathan N. Brantley, Kelly M. Wiggins, Christopher W. Bielawski. "Unclicking the Click: Mechanically Facilitated 1,3-Dipolar Cycloreversions". Science. vol. 333. p. 1606-1609. Sep. 2011.*

Mohammad Mehrmohammadi, Junghwan Oh, Srivalleesha Mallidi, and Stanislav Y.Emelianov. "Pulsed Magneto-motive Ultrasound Imaging Using Ultrasmall Magnetic Nanoprobes". Mol Imaging. Apr. 2011 ; 10(2): 102-110.*

Junghwan Oh, Marc D Feldman, Jeehyun Kim, Chris Condit, Stanislav Emelianov and Thomas E Milner. "Detection of magnetic nanoparticles in tissue using magneto-motive ultrasound". 2006 Nanotechnology (17) 4183.*

Tomas Jansson, Maria Evertsson, Esayas Atile, Roger Andersson, Sarah Fredriksson, Hans W Persson, Ingrid Svensson, Magnus Cinthio. "Induced tissue displacement in magnetomotive ultrasound imaging—simulations and experiments". 2014, IEEE Inter. Ultrasonics Symp. Proc. 639-642.*

Danilowicz, Claudia et al., "Dissociation of Ligand-Receptor Complexes Using Magnetic Tweezers," Analytical Chemistry, May 15, 2005, vol. 77, No. 10, pp. 3023-3028.

International Patent Application No. PCT/US2014/062341, International Search Report and Written Opinion dated Jan. 29, 2015, 11 pages.

* cited by examiner

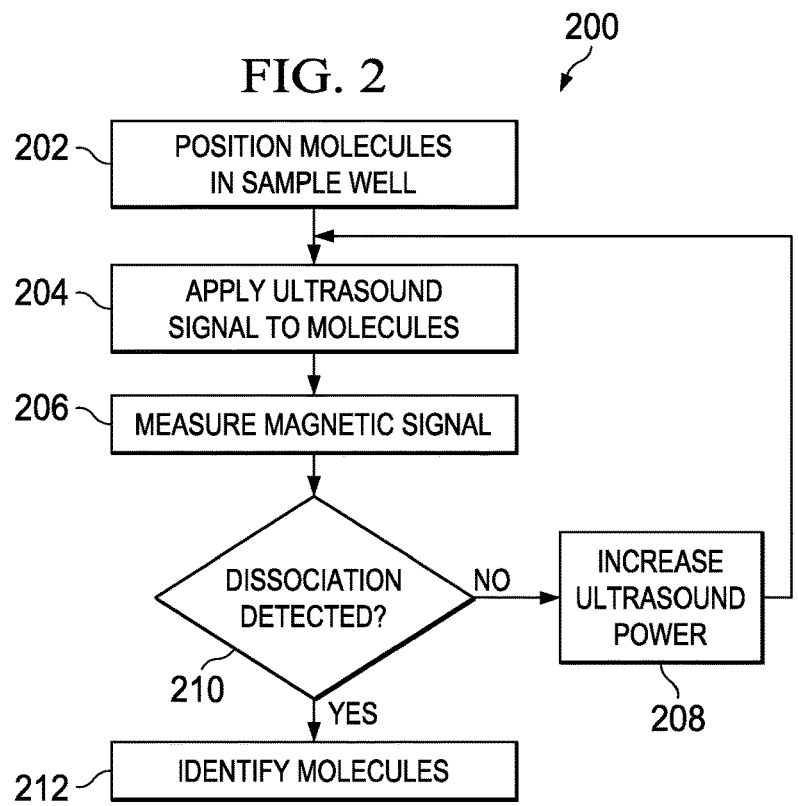
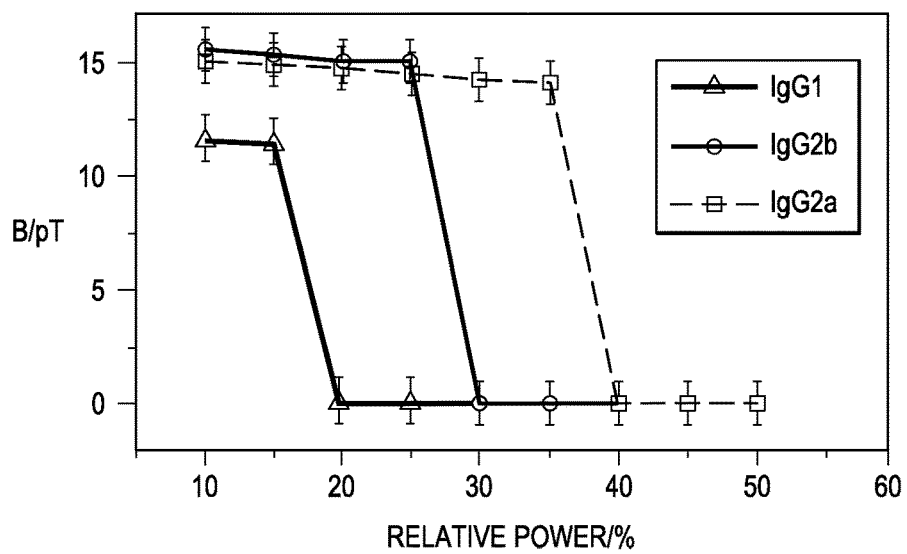

SYSTEM AND METHOD FOR ULTRASOUND IDENTIFICATION AND MANIPULATION OF MOLECULAR INTERACTIONS

CROSS-REFERENCE TO RELATED APPLICATIONS

This application claims the benefit of U.S. provisional patent application Ser. No. 61/896,214 filed Oct. 28, 2013, and entitled "System and Method for Ultrasound Identification and Manipulation of Molecular Interactions," which is hereby incorporated by reference in its entirety for all purposes.

BACKGROUND

Ultrasound has been commonly used for cleaning purposes and extracting biological entities from cells. Ultrasound imaging is among the most practiced medical imaging techniques. Recently, ultrasound has also been used in organic chemistry for promoting synthesis of desired products.

SUMMARY

A system and method for resolving and/or mechanically manipulating molecular bonds is disclosed herein. In one embodiment, a system for resolving molecular bonds includes an ultrasonic probe, a magnetometer, and a controller. The ultrasonic probe is configured to direct ultrasound radiation to molecules to be manipulated. The magnetometer is configured to measure magnetic signal associated with the molecules. The controller is coupled to the ultrasonic probe and the magnetometer, and is configured to monitor the measured magnetic signal, and determine based on the measured magnetic signal whether the ultrasound radiation has induced dissociation of bonds binding the molecules.

In another embodiment, a method for resolving molecular bonds includes applying ultrasound to molecules to be manipulated. A magnetic signal associated with the molecules while the ultrasound is applied to the molecules. Whether the ultrasound has caused dissociation of the bonds between the molecules is determined based on measurements of the magnetic signal.

In a further embodiment, a system for manipulating non-covalent bonds includes an ultrasonic probe, a magnetometer, and a controller. The ultrasonic probe is configured to direct ultrasound radiation to molecules to be manipulated. The magnetometer is configured to measure magnetic signal associated with the molecules. The controller is coupled to the ultrasonic probe and the magnetometer, and is configured to control the power of the ultrasound radiation, and to set the power of the ultrasound radiation such that the ultrasound radiation induces dissociation of non-covalent bonds binding the molecules and is within 10% of a minimum powered needed to induce dissociation of the non-covalent bonds.

BRIEF DESCRIPTION OF THE DRAWINGS

For a detailed description of exemplary embodiments of the invention, reference will now be made to the accompanying drawings in which:

FIG. 2 shows a flow diagram for a method for using ultrasound to probe and manipulate molecular bonds in accordance with principles disclosed herein;

FIGS. 3A and 3B show results of use of ultrasound to identify proteins in accordance with principles disclosed herein;

NOTATION AND NOMENCLATURE

Figure 1:
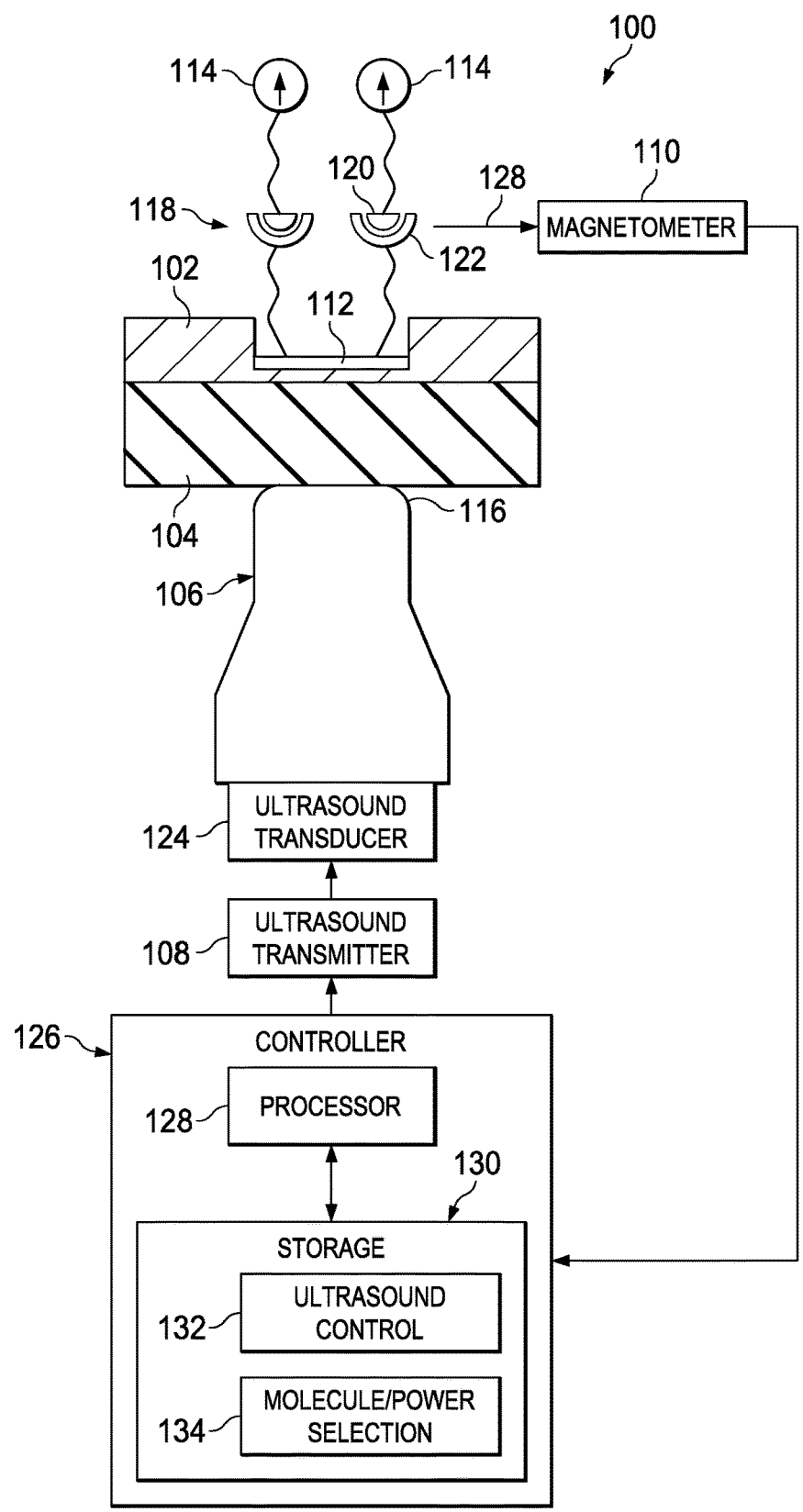
FIG. 1 shows a schematic diagram for a system for using ultrasound to probe and manipulate molecular bonds in accordance with principles disclosed herein.

In the following discussion and in the claims, the terms "including" and "comprising" are used in an open-ended fashion, and thus should be interpreted to mean "including, but not limited to . . . ." In addition, the term "couple" or "couples" is intended to mean either an indirect or a direct connection. Thus, if a first device couples to a second device, that connection may be through a direct connection, or through an indirect connection accomplished via other devices and connections. Further, the term "software" includes any executable code capable of running on a processor, regardless of the media used to store the software. Thus, code stored in memory (e.g., non-volatile memory), and sometimes referred to as "embedded firmware," is included within the definition of software. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

While ultrasound has been applied to number of applications, there have been no attempts to use precisely controlled ultrasound to generate acoustic radiation force (ARF) for mechanical manipulation of noncovalent bonds. Noncovalent binding is a major pathway for molecular recognition in chemical and biological processes. Examples include drug molecules targeting their hosts and antibodies binding their specific antigens. The bonds formed are usually specific to molecular structures including DNA sequences, with characteristic binding strengths. Accordingly, measurement of binding strength is important to the mechanistic studies of these processes and their potential mechanical manipulation. Conventional techniques, such as atomic force microscopy (AFM) and optical tweezers, cannot be used for noninvasive measurements and manipulation.

Force-induced remnant magnetization spectroscopy (FIRMS) techniques can precisely determine the well-defined binding forces of antibody-antigen bonds and DNA duplexes with single-basepair resolution. However, the shaking and centrifugal forces that are characteristic of FIRMS have limitations for achieving mechanical control of noncovalent molecular bonds, particularly under in vivo conditions. For example, the force generators, either shakers or centrifuges, are difficult to integrate with the atomic magnetometer, which is used for signal measurements.

Due to the aforementioned shortcomings of conventional techniques, a method and system for achieving selective dissociation and mechanical control of noncovalent bonds that applies a different type of force with greater viability and smaller apparatus footprint is highly desirable. Embodiments of the present disclosure employ ultrasound radiation to selectively dissociate molecular bonds. Embodiments provide unprecedented precision in resolving antibodies of different subclasses and DNAs with single-basepair differences.

Embodiments of the present disclosure are suitable for application in in-vitro applications. Molecular interactions can be measured, for example, for improving binding specificity of antibodies, for structural optimization of drug molecules, for detection of specific molecules as disease indicators.

FIG. 1 shows a schematic diagram for a system 100 for using ultrasound to probe and manipulate molecular bonds in accordance with principles disclosed herein. The system 100 includes a sample well 102, an attenuator 104, an ultrasound probe 106, an ultrasound transmitter 108, and a magnetometer 110. Some embodiments of the system 100 may include more than one sample well 102.

The sample well 102 is arranged to hold a pair (or one or more) of molecules 118. The pair of molecules 118 may be bound by noncovalent bonds. The molecules of the pair are respectively denoted as ligand 120 and receptor 122. One molecule of the pair is immobilized on the bottom surface 112 of the sample well 102. The other molecule of the pair is labeled with a magnetic particle 114. In some embodiments, the magnetic particle 114 may range in size from about 10 nanometers to about 10 micrometers. The molecules 118 may include, for example, antibodies, antigens, DNA/RNA fragments, drug molecules, proteins, and combinations thereof.

The ultrasound probe 106 includes an ultrasound transducer 124 that converts an electrical signal to an ultrasonic signal. For example, the ultrasound transducer 124 may include a piezoelectric element that converts an electrical signal to an ultrasonic signal. The ultrasound transducer 124 is coupled to the ultrasound transmitter 108. The ultrasound transmitter 108 generates the electrical signal that is applied to the ultrasound transducer 124. The ultrasound transmitter 108 may allow for variation of the power of the ultrasonic signal generated by the ultrasound transducer 124. In some embodiments, the ultrasound probe 106 and ultrasound transmitter 108 may be embodied in an ultrasound generation system such as the Q55 SONICATOR produced by QSONICA LLC. Some embodiments of the ultrasound transmitter 108 provide power accuracy of approximately 0.1% or better.

The attenuator 104 is disposed between the sample well 102 and the tip 116 of the ultrasound probe 106. The attenuator 104 reduces the magnitude of the ultrasonic signal at the sample well 102 relative to that generated by the ultrasonic probe 106. The attenuator 104 may be formed of rubber, ceramic, liquid, plastic, or other material or combination of materials that attenuates ultrasound transmissions. In some embodiments of the system 100, the ultrasound transmitter 108 and ultrasound probe 106 may provide ultrasound signals at suitable amplitudes and with suitable precision to allow for omission of the attenuator 104.

The magnetometer 110 measures magnetic signal 128 associated with the pair of molecules 118. The magnetometer 110 may be, for example, an atomic magnetometer or other device for measuring magnetic fields. The ultrasound signal applied to the molecules 118 can produce dissociation of the noncovalent bonds. The dissociation of the noncovalent bonds is indicated by a decrease of the magnetic signal measured by the magnetometer 110 because the magnetic dipoles of the dissociated particles undergo Brownian motion that randomizes the magnetic dipoles.

The system 100 may also include a controller 126. The controller 126 may be coupled to the magnetometer 100 and/or the ultrasound transmitter 108. The controller 126 may include a processor 128 and storage 130. The processor 128 is an instruction execution device that executes instructions retrieved from the storage 130. A processor suitable for use as the processor 128 may be a general-purpose microprocessor, digital signal processor, microcontroller, or other devices capable of executing instructions retrieved from a computer-readable storage medium. Processor architectures generally include execution units (e.g., fixed point, floating point, integer, etc.), storage (e.g., registers, memory, etc.), instruction decoding, peripherals (e.g., interrupt controllers, timers, direct memory access controllers, etc.), input/output systems (e.g., serial ports, parallel ports, etc.) and various other components and sub-systems.

The storage 130 is a non-transitory computer-readable storage device suitable for storing instructions executable by the processor 128. The storage 130 may include volatile storage such as random access memory, non-volatile storage (e.g., a hard drive, an optical storage device (e.g., CD or DVD), FLASH storage, read-only-memory), or combinations thereof. The storage 130 contains software instructions that are executed by the processor 128 and data (e.g., measurements of magnetic signal 128, information specifying ultrasound power needed to induce dissociation of bonds of particular molecules, etc.) that is manipulated by the processor 128. The processor 128 may execute the instructions retrieved from the storage 130 to provide control and data processing functionality to the controller 126.

The storage 130 includes ultrasound control logic 132 and molecule/power selection logic 134. The processor 128 executes instructions of the ultrasound control logic 132 to control the power output of the ultrasound transmitter 108, and in turn control the ultrasound power output of the ultrasound probe 106 and the ultrasound power delivered to the molecules 118. The processor 128 executes instructions of the molecule/power selection logic 134 to identify the molecules 118 based on the ultrasound power delivered to the molecules 118 when dissociation of the bonds of the molecules 118 is detected via the magnetic signal 128. The processor 128 also executes instructions of the molecule/power selection logic 134 to select an ultrasound power level to apply to the molecules 118 to induce dissociation (e.g., if the identity of the molecules 118 is known).

Accordingly, the controller 126 may control the power output of the ultrasound transmitter 108, and monitor the measurement values generated by the magnetometer 110 via execution of instructions by the processor 128. The controller 126 may incrementally increase the ultrasound power produced by the ultrasound transmitter 108 until measurements of the magnetic signal associated with the molecules 118, provided by the magnetometer 110, indicate dissociation of the molecular bonds. The controller 126 may limit the ultrasound power delivered to the molecules 118 to a minimum level needed to induce dissociation of molecular bonds. For example, the controller 126 may limit the ultrasound power to no more than a predetermined level (e.g., 5%, 10%, 1 milli-watt; 0.1 milli-watt, etc.) above the minimum ultrasound power needed to induce dissociation of molecular bonds. The controller 126 may identify the molecules 118 based on level of ultrasound power applied to produce the dissociation.

Thus, embodiments of the system 100 apply precisely tuned ultrasound to resolve molecular bonds with high resolution. The acoustic radiation force produced by the ultrasound radiation is noninvasive, allowing noninvasive control of the molecular bonds, for example, to remove the binding between drug molecules and their undesired targets. The ultrasound probe 106 is small and in some embodiments can be integrated with the magnetometer 110. The system 100 may be a stand-alone device that is capable of precisely resolving molecular interactions, and may be applied under conditions under which conventional force-based devices are not viable, such as in vivo conditions. For example, embodiments of the system 100 may be applied in vivo to dissociate drug molecules from healthy cells while molecules of the drug remain bound to predetermined target cells.

Some embodiments of the system 100, for example embodiments intended for in vivo applications, may lack the sample well 102. In such embodiments, an animal model, a human subject, or other source containing molecules to be manipulated may serve as a substitute for the sample well 102.

FIG. 2 shows a flow diagram for a method 200 for using ultrasound to probe and manipulate molecular bonds in accordance with principles disclosed herein. Though depicted sequentially as a matter of convenience, at least some of the actions shown can be performed in a different order and/or performed in parallel. Additionally, some embodiments may perform only some of the actions shown. In some embodiments, at least some of the operations of the method 200 may be provided by a processor executing instructions stored in a computer-readable medium.

In block 202, molecules to be analyzed or manipulated are positioned in the sample well 102, or other molecule containing structure, such as a biological entity. The molecules may include a pair of molecules with noncovalent bonds. One molecule of the pair may be immobilized on the bottom surface of the sample well 102, and the other molecule of the pair may be labeled with a magnetic particle.

In block 204, ultrasound signal is applied to the molecules via an ultrasound probe 106 coupled to the sample well 102.

In block 206, magnetic signal associated with the molecules is measured via the magnetometer 110.

In block 208, whether the measured magnetic signal indicates dissociation of the noncovalent bond is determined. If dissociation is detected, then in block 212, the molecules may be identified based on the ultrasound signal power applied to produce the dissociation.

If dissociation is not detected in block 210, then the ultrasound power is increased in block 508, and the method 200 continues by applying ultrasound signal at the increased power level to the molecules in block 204.

Figure 3B:
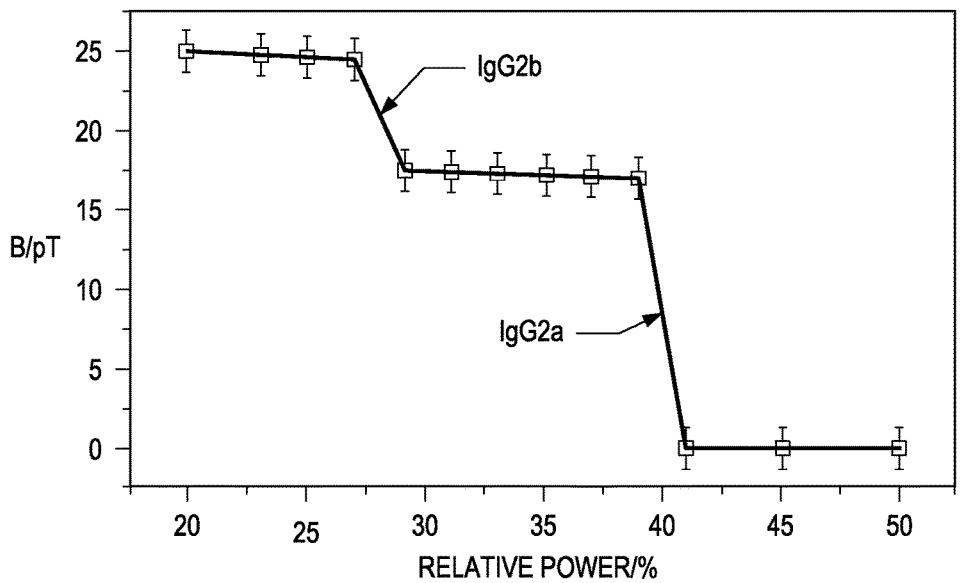

FIGS. 3A and 3B show results of use of ultrasound to identify proteins in accordance with principles disclosed herein. In FIG. 3A, the system 100 is applied to induce dissociation of a series of three noncovalent bonds: protein A binding mouse IgG1, IgG2b, and IgG2a, respectively. Magnetic signal vs. ultrasound power for each bond is shown. The antibodies are immobilized on the surface. Protein A-conjugated magnetic particles are added to form noncovalent bonds. The results show that the bonds dissociated at three different ultrasound power levels: 20%, 30%, and 40% for IgG1, IgG2b, and IgG2a, respectively. The order of the dissociation powers is consist with the known binding strengths of the antibodies to protein A.

FIG. 3B shows the resolving capability of the system 100 for different bonds. In FIG. 3B, precisely adjusted ultrasound is applied on the sample well 102 containing both IgG2a and IgG2b using a 2% power increment step. The magnetic field profile as a function of the ultrasound power is shown in FIG. 3B. Two dissociations are shown, a first at 29% and a second at 41%. With reference to the results of FIG. 3A, the first dissociation is attributable to the protein A-IgG2b bonds, and the second dissociation is attributable to the protein A-IgG2a bonds. Thus, using the system 100, the two bonds are completely resolved, with the decreases in magnetic signal representing their respective amounts.

Figure 4A:
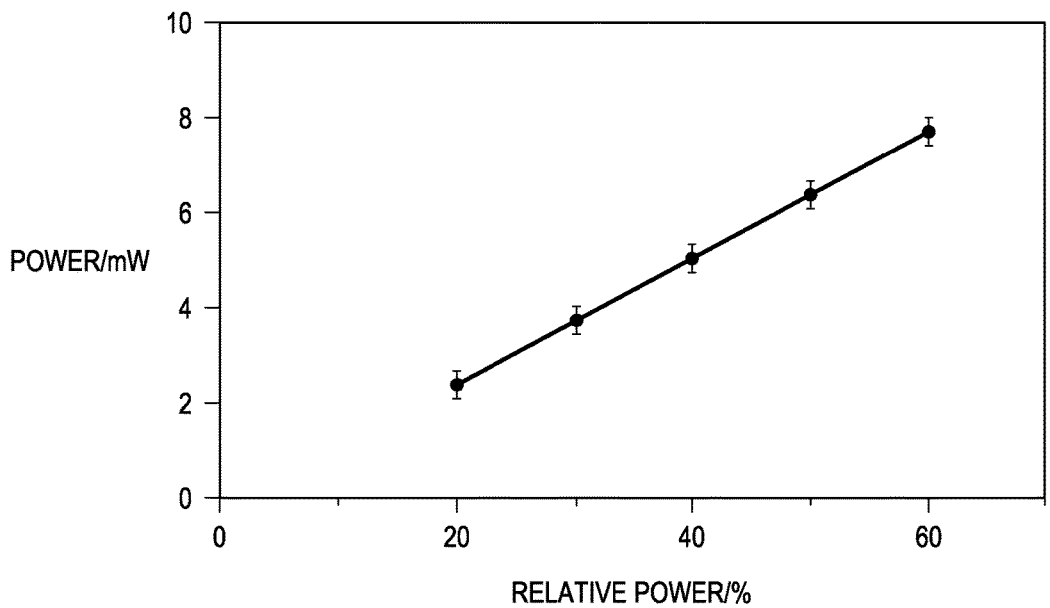
FIGS. 4A and 4B show calibration of ultrasound power in a system for probing and manipulating molecular bonds in accordance with principles disclosed herein.
Figure 4B:
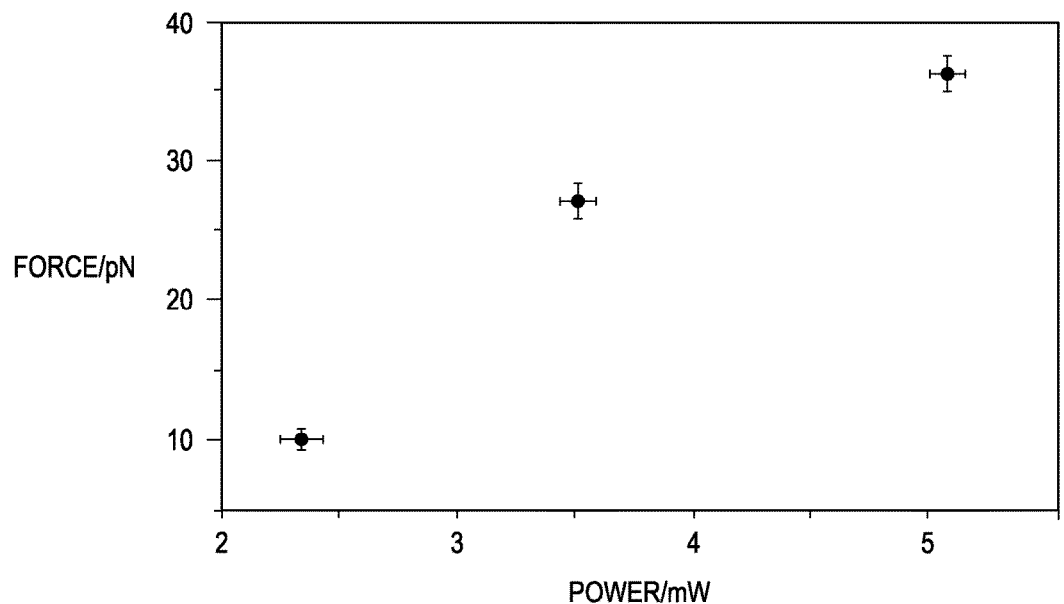

FIGS. 4A and 4B show calibration of ultrasound power in the system 100 in accordance with principles disclosed herein. FIG. 4A shows the result of calibrating the ultrasound power of an embodiment of the system 100 using a thermal method, which calculates the power as heat absorbed by a fixed volume of water. The power is in the low mW range. In an embodiment of the system 100 that employs an ultrasound transmitter 108 producing output power of tens of watts, an attenuator 104 including approximately 6.5 mm-thick rubber is applied to attenuate the power. The attenuation factor of the rubber is approximately 4400, resulting in attenuated power of 6.2 mW at an unattenuated power of approximately 27.5 W.

Using centrifugal force, the binding forces of the noncovalent bonds are calibrated to be 9, 24 and 32 picoNewtons, for protein A binding IgG1, IgG2b, and IgG2a, respectively. FIG. 4B shows correlation between the binding force and ultrasound power. Exact calculation of ARF can be challenging. Therefore, using bonds with well-characterized binding forces (protein A-IgG bonds) offers a force scale for the ARF of ultrasound radiation. The error bars on the power axis of FIG. 4B correspond to the increment step of ultrasound power, and those on the force axis correspond to the resolution of centrifugal force.

Figure 5:
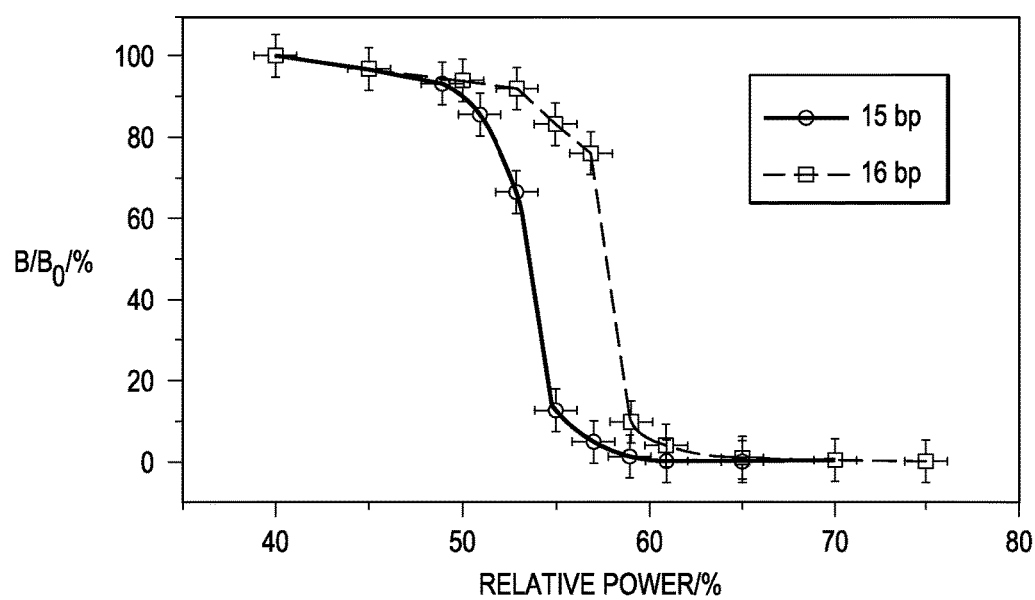
FIG. 5 shows results of use of ultrasound to resolve DNA duplexes in accordance with principles disclosed herein.

In addition to resolving the protein A-IgG bonds, the system 100 can be used to dissociate DNA duplexes with single-basepair (bp) precision. FIG. 5 shows results of use of ultrasound to resolve DNA duplexes in accordance with principles disclosed herein. In the example of FIG. 5, two DNA duplexes were used. One was immobilized 5'-GGG TTT TTT TTT TTT GGG hybridized with magnetically labeled 3'-CCC AAA AAA AAA GGG CCC, termed as the 15-bp duplex because there were 15 complementary basepairs. The other was the same immobilized strand hybridized with magnetically labeled 5'-CCC AAA AAA AAA AGG CCC, termed as the 16-bp duplex because of the 16 complementary basepairs.

FIG. 5 shows that higher power may be needed to dissociate the DNA duplexes compared to dissociating the protein A-IgG bonds. For the 15-bp duplex, the dissociation occurred at 55% power, corresponding to 6.9 mW. For the 16-bp duplex, the dissociation power increased to 59%, or 7.4 mW. A power increment step of 2% is used in the system 100 to produce the results of FIG. 5. FIG. 5 shows that the system 100 is capable of resolving DNA duplexes with a single-bp difference. The melting point difference between the two duplexes is estimated to be 3.1° C., smaller than the 7.3° C. difference between the previous 11- and 12-bp duplexes that were resolved by centrifugal force. Furthermore, the system 100 enables power adjustment as accurate as 0.1%. Therefore, the system 100 is able to distinguish molecular bonds with even closer binding forces.

Embodiments of the system 100 are well suited for in vivo applications. The integration of ultrasound and atomic magnetometry in the system 100 produces a noninvasive device that has the potential for mechanical control of desired molecular bonds, which are important for their corresponding biological functions.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system for resolving molecular bonds, comprising:
   an ultrasonic probe configured to direct ultrasound radiation to molecules to be manipulated;
   a magnetometer configured to measure a magnetic signal associated with the molecules; and
   a controller coupled to the ultrasonic probe and the magnetometer, the controller configured to:
   incrementally increase power of the ultrasound radiation until dissociation of bonds binding the molecules is detected using the measured magnetic signal; and
   identify the molecules based on the power of the ultrasound radiation provided to induce the dissociation of the bonds.

2. The system of claim 1, wherein the molecules comprise a bonded pair of molecules and a molecule of the bonded pair is conjugated with a magnetic particle.

3. The system of claim 1, further comprising an attenuator disposed between the ultrasonic probe and the molecules, the attenuator configured to reduce amplitude of the ultrasound radiation provided to the molecules.

4. The system of claim 3, further comprising a sample well disposed between the attenuator and the molecules, the sample well configured to contain the molecules.

5. A method for resolving molecular bonds, comprising:
   generating ultrasound from an ultrasonic probe;
   attenuating power of the ultrasound by an attenuator and applying the attenuated ultrasound to molecules to be manipulated, the attenuator disposed between the molecules and the ultrasonic probe;
   measuring a magnetic signal associated with the molecules; and
   determining, based on measurements of the magnetic signal, whether the attenuated ultrasound caused dissociation of the bonds between the molecules.

6. The method of claim 5, wherein the molecules comprise a bonded pair of molecules and wherein the method further comprises conjugating a magnetic particle with a molecule of the bonded pair of molecules.

7. The method of claim 5, further comprising identifying the molecules based on power of the attenuated ultrasound applied when dissociation of the bonds is detected.

8. The method of claim 5, further comprising incrementally increasing the power of the ultrasound until dissociation of the bonds in detected.

9. The system of claim 5, wherein the attenuator comprises rubber.

10. The method of claim 5, further comprising:
    disposing the molecules in a sample well; and
    immobilizing one molecule of a pair of molecules on a surface of the sample well.

11. The method of claim 5, further comprising:
    retrieving stored information that specifies a power of the ultrasound to apply to induce dissociation of the molecules in a first type of cells of living tissue while not inducing dissociation of the molecules in a second type of cells of the living tissue;
    applying the information to control the power of the ultrasound; and
    dissociating the molecules from the first type of cells while not dissociating the molecules from the second type of cells.

12. A system for manipulating non-covalent bonds, comprising:
    an ultrasonic probe configured to direct ultrasound radiation to molecules to be manipulated;
    a magnetometer configured to measure a magnetic signal associated with the molecules;
    a controller coupled to the ultrasonic probe and the magnetometer, the controller configured to control power of the ultrasound radiation; and
    an attenuator positioned at an output of the ultrasound probe and configured to attenuate power of the ultrasound radiation.

13. The system of claim 12, wherein the controller is configured to:
    monitor the measured magnetic signal; and
    determine based on the measured magnetic signal whether the ultrasound radiation has induced dissociation of bonds binding the molecules.

14. The system of claim 12, wherein the controller is configured to identify the molecules based on the power of the ultrasound radiation provided to induce dissociation of the bonds.

15. The system of claim 12, wherein the controller is configured to:
    vary power of the ultrasound radiation produced by the ultrasonic probe; and
    incrementally increase the power of the ultrasound radiation until dissociation of the bonds is detected.

16. The system of claim 12, wherein the attenuator comprises rubber.

* * * * *

UNITED STATES PATENT AND TRADEMARK OFFICE
CERTIFICATE OF CORRECTION

PATENT NO. : 10,112,169 B2
APPLICATION NO. : 14/524207
DATED : October 30, 2018
INVENTOR(S) : Shoujun Xu, Lashan De Silva and Li Yao It is certified that error appears in the above-identified patent and that said Letters Patent is hereby corrected as shown below:

In the Specification

Column 1, Line 14, Please add the following paragraph:
--STATEMENT REGARDING FEDERALLY SPONSORED RESEARCH OR DEVELOPMENT
This invention was made with government support under 1028328 awarded by the National Science Foundation. The government has certain rights in the invention.--

Signed and Sealed this
Nineteenth Day of March, 2024

Katherine Kelly Vidal
*Director of the United States Patent and Trademark Office*